(12) United States Patent
Ahn

(10) Patent No.: US 11,038,076 B2
(45) Date of Patent: Jun. 15, 2021

(54) COPPER HALIDE COLOR PHOTOSENSOR STRUCTURE AND MANUFACTURING METHOD

(71) Applicant: PETALUX INC., Seongnam-si (KR)

(72) Inventor: Do Yeol Ahn, Seoul (KR)

(73) Assignee: PETALUX INC., Seongnam-si (KR)

( * ) Notice: Subject to any disclaimer, the term of this patent is extended or adjusted under 35 U.S.C. 154(b) by 0 days.

(21) Appl. No.: 16/626,759

(22) PCT Filed: Aug. 10, 2018

(86) PCT No.: PCT/KR2018/009193
§ 371 (c)(1),
(2) Date: Dec. 26, 2019

(87) PCT Pub. No.: WO2019/045313
PCT Pub. Date: Mar. 7, 2019

(65) Prior Publication Data
US 2020/0235257 A1    Jul. 23, 2020

(30) Foreign Application Priority Data
Aug. 29, 2017 (KR) .................. 10-2017-0109351

(51) Int. Cl.
*H01L 31/10*       (2006.01)
*H01L 31/101*      (2006.01)
(Continued)

(52) U.S. Cl.
CPC ...... *H01L 31/1013* (2013.01); *H01L 31/0336* (2013.01); *H01L 31/18* (2013.01)

(58) Field of Classification Search
CPC .. H01L 31/1013; H01L 31/0336; H01L 31/18
See application file for complete search history.

(56) References Cited

U.S. PATENT DOCUMENTS

| 5,965,875 A | 10/1999 | Merrill |
| 7,233,036 B1 | 6/2007 | Hsu et al. |
| 2011/0149102 A1 | 6/2011 | Toda |

FOREIGN PATENT DOCUMENTS

| JP | 5-343661 | 12/1993 |
| KR | 10-2004-0089588 | 10/2004 |

(Continued)

OTHER PUBLICATIONS

The International Search Report corresponding to International Application No. PCT/KR2018/009193 dated Nov. 26, 2018.

(Continued)

*Primary Examiner* — Matthew L Reames
(74) *Attorney, Agent, or Firm* — Kile Park Reed & Houtteman PLLC

(57) ABSTRACT

The present invention relates to a structure of an photosensor structure having improved optical properties by including a copper halide region, and a method of manufacturing the same. The photosensor structure includes a silicon semiconductor substrate and junctions formed in the silicon semiconductor substrate and having regions of at least three opposite polarities. The junctions may be arranged substantially vertically aligned with each other, and at least one of the junctions may be a junction of a copper halide region of a first polarity and a silicon region of a second polarity. Accordingly, the quantum efficiency is improved by the optical characteristics of the copper halide, and the effect of reducing the size of the manufactured photosensor can be obtained.

12 Claims, 5 Drawing Sheets

(51) Int. Cl.
    *H01L 31/0336*    (2006.01)
    *H01L 31/18*      (2006.01)

(56) References Cited

FOREIGN PATENT DOCUMENTS

| KR | 10-1660795 | 9/2016 |
|----|------------|--------|
| KR | 10-1742073 | 6/2017 |

OTHER PUBLICATIONS

K.V. Rajani et al., "Deposition of earth-abundant p-type CuBr films with high hole conductivity and realization of p-CuBr/n-Si heterojunction solar cell", Materials Letters, Aug. 17, 2013, vol. 111, pp. 63-66.

Dominik Danieluk et al., "Optical properties of updoped and oxygen doped CuCl films on silicon substrates", Journal of Material Science: Materials in Electronics, (2009), pp. S76-S80.

Extended European Search Report, corresponding to European Application No./Patent No. 18850970.7, dated Sep. 30, 2020.

English translation of Written Opinion, corresponding to International Application No. PCT/KR2018/009193, dated Mar. 3, 2020.

COPPER HALIDE COLOR PHOTOSENSOR STRUCTURE AND MANUFACTURING METHOD

TECHNICAL FIELD

The present invention relates to copper halide color photosensor structure and manufacturing method, and more particularly, the present invention relates to a structure of an photosensor with improved optical properties including a copper halide region and method of manufacturing the same.

BACKGROUND ART

In conventional, active pixel sensors of multiple wavelengths are well known. One type of the active pixel sensors of multiple wavelengths includes red, green, and blue sensors horizontally disposed on or adjacent to a semiconductor substrate. However, these sensors have a disadvantage in that they are combined with each other in a plane and occupy a relatively large area per pixel. Further, as the size of the photosensor becomes smaller, the size of the photodiode becomes smaller than the wavelength of light, and the probability that incident light generates a carrier decreases, resulting in a rapid drop in quantum efficiency.

To solve this problem, as shown in FIG. 1, a sensor with photosensors arranged in a vertical direction for detecting a plurality of wavelengths respectively have been developed, and a triple-well photosensor in which photosensors of blue, green and red sensitive p-n junctions are constituted is provided.

However, a triple-well photosensor formed based on a silicon semiconductor has demerits of decreasing light when passing through the silicon semiconductor, so that new photosensor with enhanced optical efficiency is required.

DETAILED DESCRIPTION OF THE INVENTION

Objects of the Invention

An object of the present invention is to provide an photosensor with improved optical efficiency.

Another problem to be solved by the present invention is to reduce the size of the photosensor by using copper halide.

Technical Solution

In order to solve such a problem, a color photosensor structure according to an exemplary embodiment of the present invention includes a silicon semiconductor substrate and junctions formed in the silicon semiconductor substrate and having regions of at least three opposite polarities.

The junctions may be arranged substantially vertically aligned with each other, and at least one of the junctions may be a junction of a copper halide region of a first polarity and a silicon region of a second polarity.

The silicon semiconductor substrate may have a region of the first polarity.

The silicon semiconductor substrate may have a doped region in the silicon semiconductor substrate, the doped region having the second polarity opposite to the first polarity of the silicon substrate, the doped region being formed at a depth that is an absorption length of the first light wavelength in silicon to form a first photodiode, a first copper halide region formed on the doped region, the first copper halide region having the first polarity, a junction between the first copper halide region and the doped region being formed at a depth that is an absorption length of a second light wavelength in silicon or copper halide to form a second photodiode, and a second copper halide region formed on the first copper halide region, the second copper halide region having the second polarity, a junction between the second copper halide region and the first copper halide region being formed at a depth that is an absorption length of a third light wavelength in silicon or copper halide to form a third photodiode.

The first, second and third diodes may have photosensors for measuring first, second and third photocurrent, respectively.

A light having the first light wavelength may be red light, a light having the second light wavelength length may be green light, and a light having the third light wavelength length may be blue light.

The copper halide region may include CuI, CuCl or CuBr.

The first polarity may be a p-type and the second polarity may be an n-type.

The first polarity may be an n-type and the second polarity may be a p-type.

A method of manufacturing a color photosensor, includes preparing a silicon semiconductor substrate of a first polarity, doping a first region to be a second polarity to a depth that is an absorption length of the first light wavelength in a silicon in the silicon semiconductor substrate, etching a second region in the first region to a depth of a second light absorption length in silicon or copper halide, forming copper halide on the second region, and doping a third region in the second region to be a second polarity to a depth of a third light absorption length in silicon or copper halide.

Advantageous Effects

The color photosensor structure according to the present invention can improve the quantum efficiency due to the optical characteristics of copper halide and can reduce the size of the photosensor to be manufactured.

MODE FOR INVENTION

Figure 1:
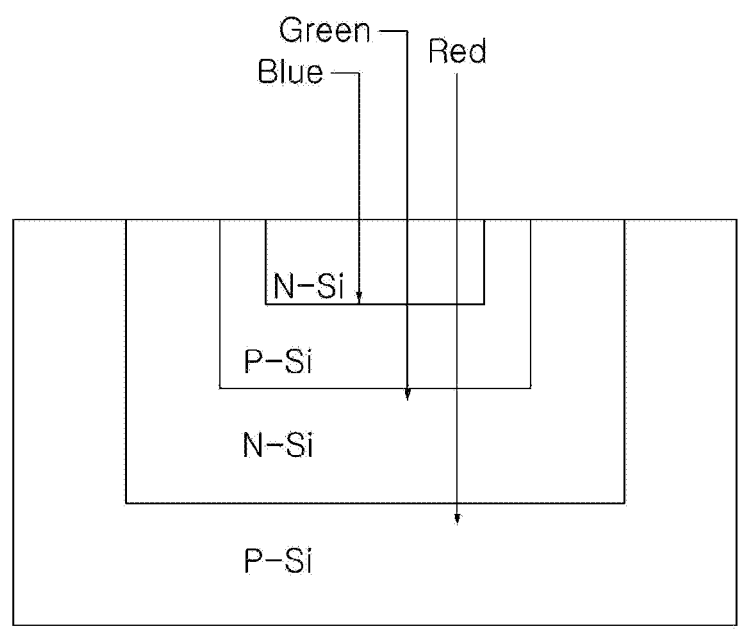
FIG. 1 is a partial cross-sectional view showing a conventional photosensor structure.

The present invention is susceptible of various modifications and various forms, specific embodiments are illustrated in the drawings and described in detail in the text. It should be understood, however, that the invention is not intended to be limited to the particular forms disclosed, but on the contrary, is intended to cover all modifications, equivalents, and alternatives falling within the spirit and scope of the invention.

The terms first, second, etc. may be used to describe various components, but the components should not be limited by the terms. The terms are used only for the purpose of distinguishing one component from another. For example, without departing from the scope of the present invention, the first component may be referred to as a second component, and similarly, the second component may also be referred to as a first component.

The terminology used herein is for the purpose of describing particular embodiments only and is not intended to be limiting of the invention. The singular forms "a," "an," and "the" include plural referents unless the context clearly dictates otherwise. In the present application, the terms "comprises" or "having", and the like, are used to specify that a feature, a number, a step, an operation, an element, a component, but do not preclude the presence or addition of one or more other features, integers, steps, operations, elements, parts or combinations thereof.

The term "formed on" means not only "formed directly on", but also another layer or film may be interposed therebetween, and the term "directly formed" on a layer means that no other layer is intervening therebetween.

Unless otherwise defined, all terms used herein, including technical or scientific terms, have the same meaning as commonly understood by one of ordinary skill in the art to which this invention belongs.

Terms such as those defined in commonly used dictionaries are to be interpreted as having a meaning consistent with the meaning in the context of the relevant art and are to be construed as ideal or overly formal in meaning unless explicitly defined in the present application.

Hereinafter, preferred embodiments of the present invention will be described in detail with reference to the drawings.

A color photosensor according to exemplary embodiments of the present invention preferably includes a silicon semiconductor substrate and at least three junctions of regions with opposite polarities, which are formed in the silicon semiconductor substrate. In addition, the junctions may be substantially vertically layered or aligned, and at least one of the junctions may be a junction of a first polarity copper halide region and a second polarity silicon region.

For example, in a color photosensor structure formed on the basis of an n-type silicon semiconductor substrate, the color photosensor structure may have a junction of an n-type copper halide region and a p-type silicon region. In a color photosensor structure formed on the basis of an p-type silicon semiconductor substrate, the color photosensor structure may have a junction of an p-type copper halide region and a n-type silicon region.

Figure 2:
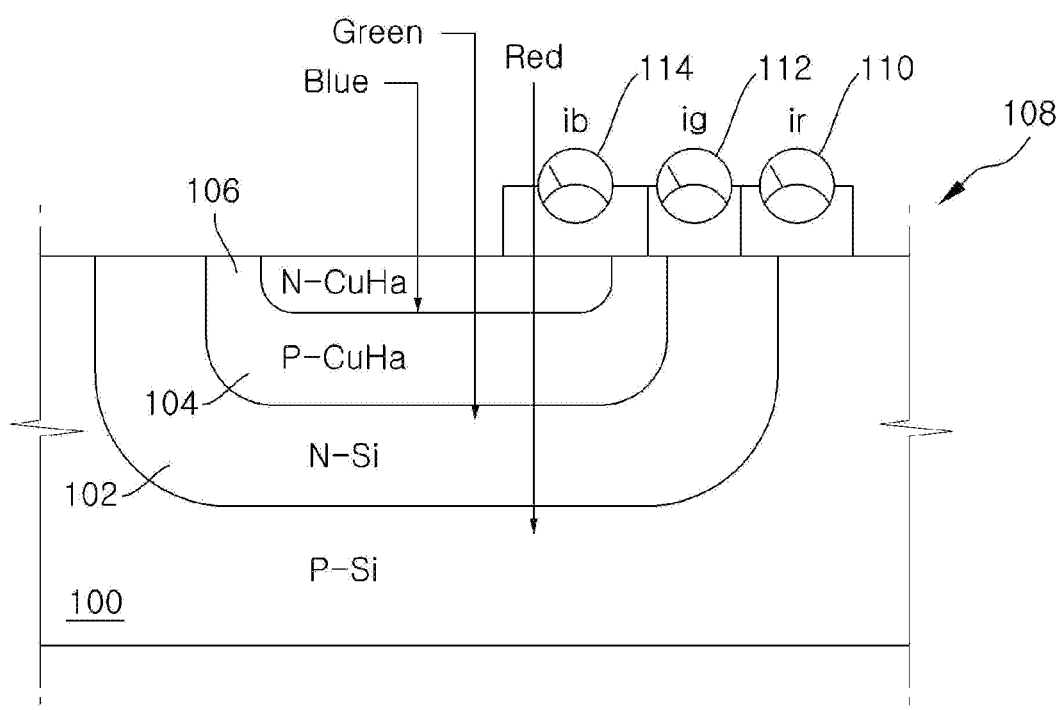
FIG. 2 is a partial cross-sectional view showing a structure of a color photosensor according to an exemplary embodiment of the present invention.
Figure 3:
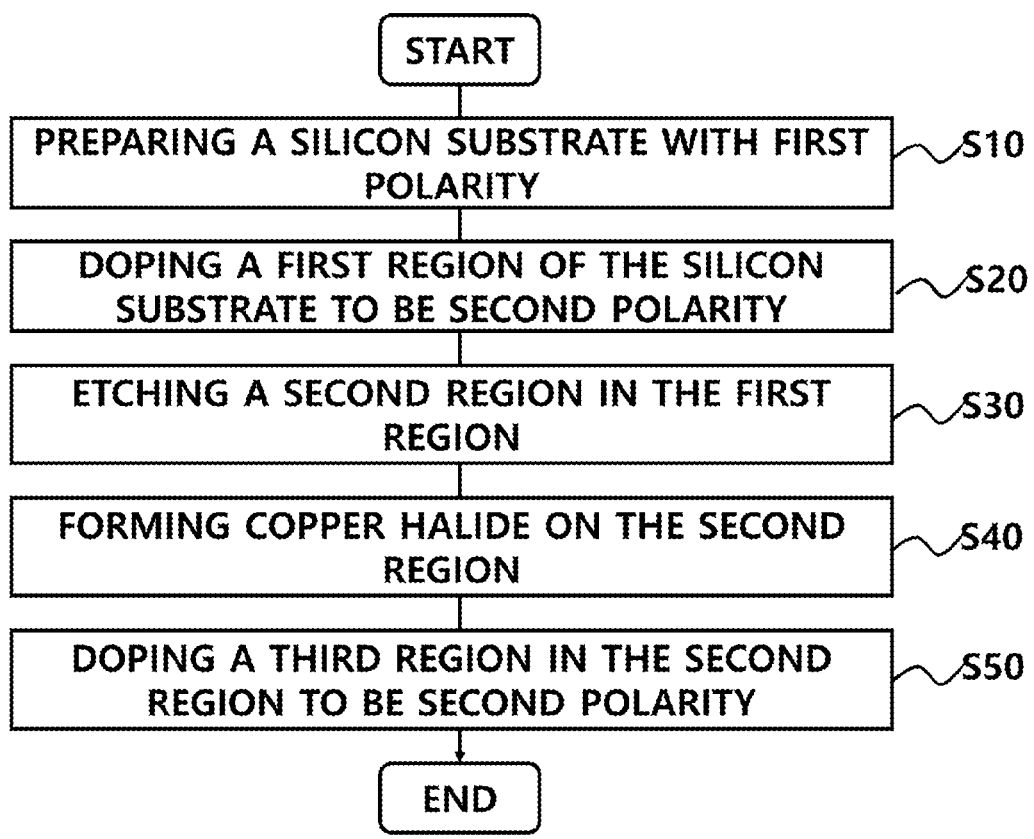
FIG. 3 is a flowchart showing a method of manufacturing the color photosensor of FIG. 2.

FIG. 2 is a partial cross-sectional view showing a structure of a color photosensor according to an exemplary embodiment of the present invention, and FIG. 3 is a flowchart showing a method of manufacturing the color photosensor of FIG. 2. FIG. 4A to 4D are cross-sectional views showing the method of manufacturing the color photosensor of FIG. 2.

Referring to FIG. 2, the junctions are arranged substantially vertically aligned with each other, and at least one of the junctions may be a junction of a first polarized copper halide region and a second polarized silicon semiconductor region.

The first polarity may be n-type or p-type, and the second polarity may be p-type or n-type.

Figure 4A:
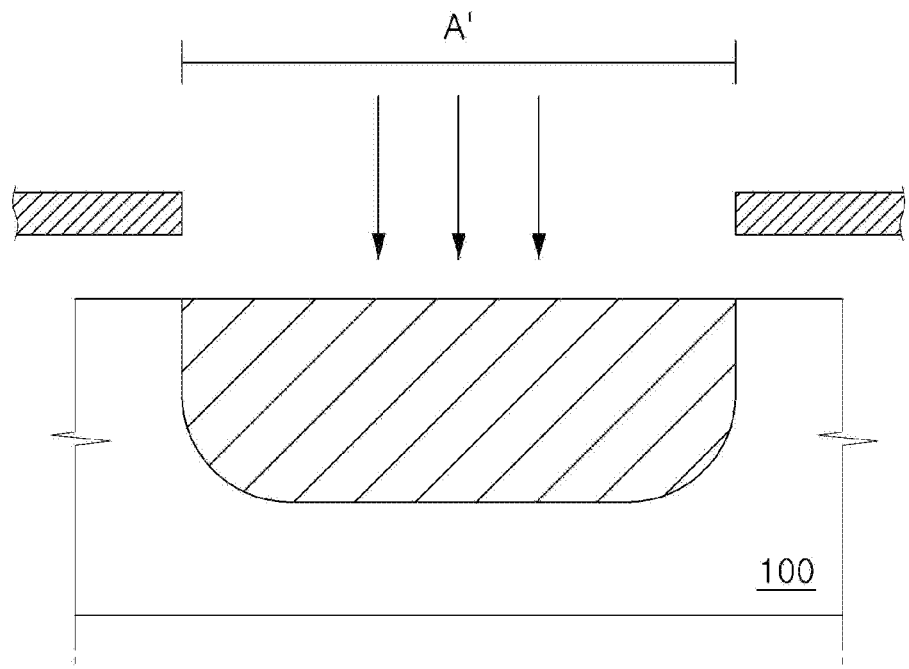
FIG. 4A to 4D are cross-sectional views showing the method of manufacturing the color photosensor of FIG. 2.

Referring to FIG. 3 and FIG. 4A, according to a color photosensor structure of an exemplary embodiment of the present invention, a silicon substrate with a first polarity is prepared (step S10) and a doped region 102 with a second polarity is formed on a first region A' in the semiconductor substrate 100 (step S20). For example, the doped region 102 may be formed at a depth in the silicon semiconductor substrate 100, which is the absorption length of the first light wavelength in the silicon, through a doping process so as to define the first photodiode. When a dopant is injected through a doping process, the p-type dopant may be any one of oxygen (O), sulfur (S) and selenium (Se), and the n-type dopant may be any one of zinc (Zn) and magnesium (Mg).

Meanwhile, the first light may be red light having a wavelength of 575 nm to 700 nm.

Figure 4B:
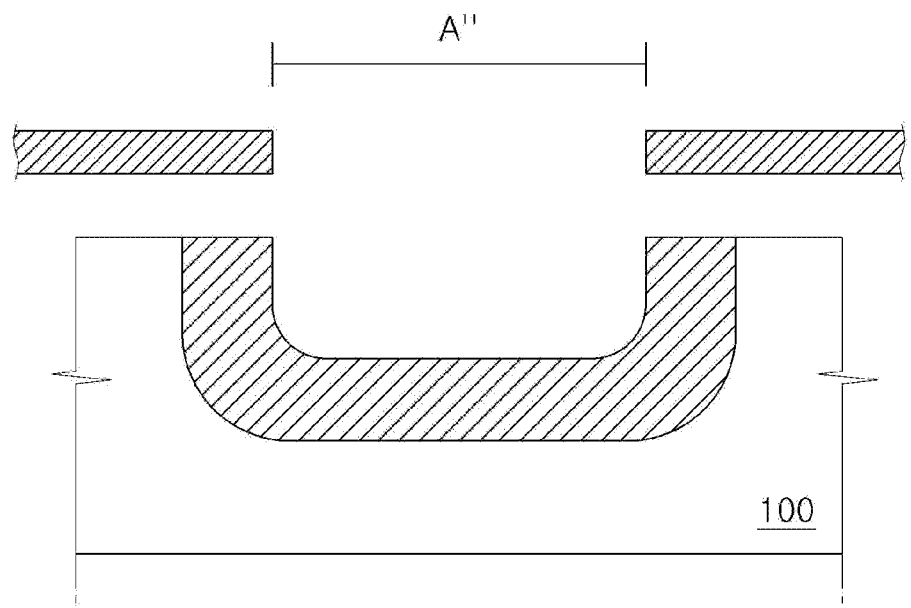
Figure 4C:
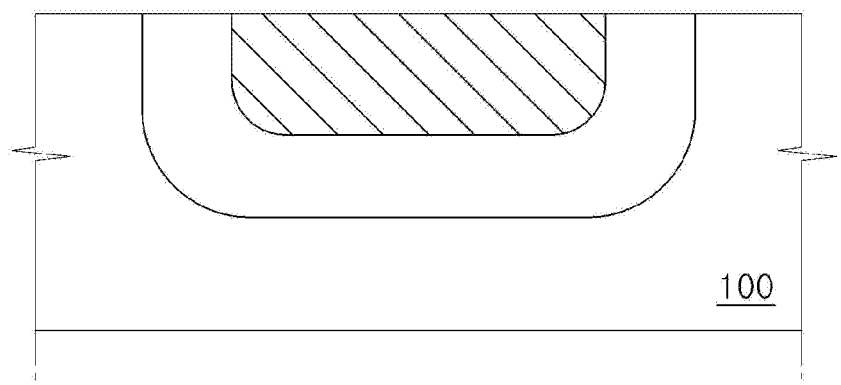
Figure 4D:
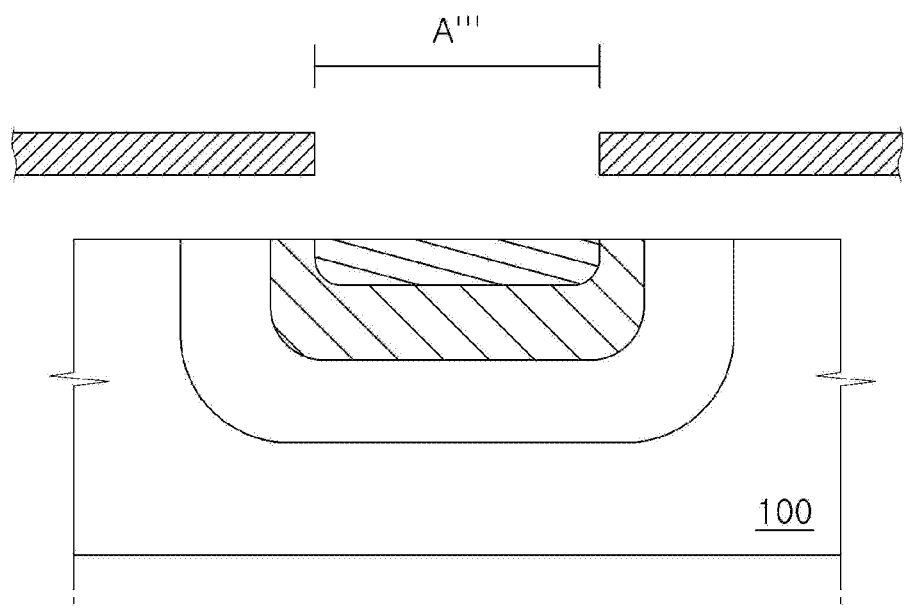

Referring to FIG. 3 and FIG. 4B through FIG. 4C, according to a color photosensor structure of an exemplary embodiment of the present invention, a first copper halide region may be formed at the doped region 102 with the second polarity. As shown in FIG. 4B, a portion of the doped region 102 with a second region A" that is smaller than the first region A' is etched (step S30), and the first copper halide is formed at the etched region of the doped region 102 (step S40) to form the first copper halide region 104. In order to form the copper halide at the etched region, a sputtering method, an MBE (molecular beam epitaxy) method, an MOCVD (metal organic chemical vapor deposition) method, an HVPE (hydride vapor phase epitaxy) method, an ALE (atomic layer epitaxy) method, etc. may be used.

The first copper halide region 104 may be formed at a depth in the silicon semiconductor substrate 100, which is the absorption length of the second light wavelength of copper halide or silicon, to define a second diode.

The band gap energies of some of the copper halide semiconductors are shown in Table 1.

TABLE 1

| | Lattice constant (Angstrom) | Bandgap energy (eV) |
| --- | --- | --- |
| Si | 5.43 | 1.1 (indirect) |
| CuCl | 5.42 | 3.399 |
| CuBr | 5.68 | 2.91 |
| CuI | 6.05 | 2.95 |

While Si is known to have a diamond structure, capper chloride (CuCl) has a zinc blend structure equivalent to a diamond structure. Particularly, the (111) surface of the silicon (Si) semiconductor substrate 100 may be suitable for the crystal structure of capper chloride, so that it may be easy to form the copper halide region to fabricate the photosensor. That is, as shown in Table 1, the copper halide semiconductor has a lattice constant similar to that of the (111) plane of silicon to have an advantage of being easy to grow.

In addition, the absorption coefficient of the semiconductor of the photon varies greatly depending on the energy of the photon and the band gap energy. As shown in Table 1, it can be seen that the band gap energy of copper halide is higher than the band gap energy of the silicon semiconductor and thus the optical characteristics are superior. That is, if using copper halide semiconductors, more photons can be collected in the active layer, thereby allowing more carriers to be generated through incident light.

That is, by using the copper halide semiconductor, the quantum efficiency of the photosensor is increased, so that the size of the photosensor can be made smaller than that of the conventional photosensor.

Meanwhile, the second light may be green light having a wavelength of 490 nm to 575 nm.

In the first copper halide region 104, a second copper halide region having a second polarity is formed again.

Referring to FIGS. 3 and 4C, the second copper halide region 106 is formed by doping dopant of the second polarity into a third region A'" smaller than the second region A" in the first copper halide region (step S50). For example, the junction between the first and second copper halide regions may be formed at a depth in the first copper halide, which is the absorption length of the third light wavelength in the silicon or copper halide through a doping process so as to define the third photodiode.

When a dopant is injected through a doping process, the p-type dopant may be any one of oxygen (O), sulfur (S) and selenium (Se), and the n-type dopant may be any one of zinc (Zn) and magnesium (Mg).

Meanwhile, the third light may be blue light having a wavelength of 400 nm to 490 nm.

On the other hand, in an exemplary embodiment of the present invention, since the copper halide semiconductor generally operates as the p-type, when the copper halide semiconductor is p-type, the n-type dopant is doped only in the third region A''' to form the second copper halide region 106. However, when the silicon semiconductor substrate 100 is the n-type, the first halogenated region may further include the n-type dopant to be the n-type.

When a dopant is injected through a doping process, the p-type dopant may be any one of oxygen (O), sulfur (S) and selenium (Se), and the n-type dopant may be any one of zinc (Zn) and magnesium (Mg).

Those skilled in the art will appreciate that the sensitive depletion regions of the first to third photodiodes extend somewhat above and below the junction depth. Also as described above, the color photosensor structure according to one embodiment of the present invention may be embodied by forming deep P doped region of N silicon substrate, N doped region in the deep P doped region, and a swallow P doped region in the N doped region, and the regions may be formed to have opposite polarities.

Additionally, a color photosensor according to one embodiment of the present invention may include a sensing mechanism 108 connected to red, green, and blue photodiodes for measuring red, green, and blue photocurrents across three photodiodes, respectively. Preferably the sensing mechanism 108 may include a first ammeter 110 connected across the red photodiode to measure the red photocurrent ir, a second ammeter 112 for measuring the green photocurrent ig, and a third ammeter 114 for measuring photocurrent ib.

Although the present invention has been described in the detailed description of the invention with reference to exemplary embodiments of the present invention, it will be understood to those skilled in the art that various modifications and variation can be made in the present invention without departing from the spirit or scope of the invention.

The invention claimed is:

1. A color photosensor structure comprising:
    a silicon semiconductor substrate; and
    junctions formed in the silicon semiconductor substrate and having regions of at least three opposite polarities, wherein the junctions are arranged substantially vertically aligned with each other, at least one of the junctions being a junction of a copper halide region of a first polarity and a silicon region of a second polarity.

2. The color photosensor structure of claim 1, wherein the silicon semiconductor substrate has a region of the first polarity.

3. The color photosensor structure of claim 2, wherein the silicon semiconductor substrate comprises:
    a doped region in the silicon semiconductor substrate, the doped region having the second polarity opposite to the first polarity of the silicon substrate, the doped region being formed at a depth that is an absorption length of the first light wavelength in silicon to form a first photodiode;
    a first copper halide region formed on the doped region, the first copper halide region having the first polarity, a junction between the first copper halide region and the doped region being formed at a depth that is an absorption length of a second light wavelength in silicon or copper halide to form a second photodiode; and
    a second copper halide region formed on the first copper halide region, the second copper halide region having the second polarity, a junction between the second copper halide region and the first copper halide region being formed at a depth that is an absorption length of a third light wavelength in silicon or copper halide to form a third photodiode.

4. The color photosensor structure of claim 3, wherein a light having the first light wavelength is red light, a light having the second light wavelength length is green light, and a light having the third light wavelength length is blue light.

5. The color photosensor structure of claim 1, wherein the copper halide region comprises Cut, CuCl or CuBr.

6. The color photosensor structure of claim 1, wherein the first polarity is a p-type and the second polarity is an n-type.

7. The color photosensor structure of claim 1, wherein the first polarity is an n-type and the second polarity is a p-type.

8. A method of manufacturing a color photosensor, comprising:
    preparing a silicon semiconductor substrate of a first polarity;
    doping a first region to be a second polarity to a depth that is an absorption length of the first light wavelength in a silicon in the silicon semiconductor substrate;
    etching a second region in the first region to a depth of a second light absorption length in silicon or copper halide;
    forming copper halide on the second region; and
    doping a third region in the second region to be a second polarity to a depth of a third light absorption length in silicon or copper halide.

9. The method of claim 8, wherein a light having the first light wavelength is red light, a light having the second light wavelength is green light, and a light having the third light wavelength length is blue light.

10. The method of claim 8, wherein the copper halide comprises Cut, CuCl or CuBr.

11. The method of claim 8, wherein the first polarity is a p-type and the second polarity is an n-type.

12. The method of claim 8, wherein the first polarity is an n-type and the second polarity is a p-type.

* * * * *